United States Patent
Hau-Riege et al.

(10) Patent No.: US 6,714,037 B1
(45) Date of Patent: Mar. 30, 2004

(54) METHODOLOGY FOR AN ASSESSMENT OF THE DEGREE OF BARRIER PERMEABILITY AT VIA BOTTOM DURING ELECTROMIGRATION USING DISSIMILAR BARRIER THICKNESS

(75) Inventors: Christine Hau-Riege, Fremont, CA (US); Amit Marathe, Milpitas, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/179,163

(22) Filed: Jun. 25, 2002

(51) Int. Cl.[7] .............................................. G01R 27/26
(52) U.S. Cl. ................................... 324/766; 324/158.1
(58) Field of Search .......................... 257/758, 40, 48, 257/767, 773; 29/825; 324/766, 158.1, 716, 719, 73.1, 765, 537, 538, 769, 713

(56) References Cited

U.S. PATENT DOCUMENTS

| | | | |
|---|---|---|---|
| 5,612,627 A | | 3/1997 | Bui et al. |
| 5,786,705 A | * | 7/1998 | Bui et al. .................... 324/766 |
| 5,900,735 A | * | 5/1999 | Yamamoto ................... 324/537 |
| 6,388,269 B1 | * | 5/2002 | Saito ........................... 257/48 |

OTHER PUBLICATIONS

"MIT/EmSim: Electromigration Simulator";, C. V. Thompson, W. Fayad, Y. J. Park, V. K. Andleigh, M. Verminski and S. P. Riege, printed from the Internaet at htt://utopial.mit-.edu/emsim/. 4 pgs.

"In–Situ Studies of Electromigration Voiding in Passivated Copper Interconnects", M. E. Meier, T. N. Marieb, P. A. Flinn, R. J. Gleixner and J. C. Bravman, date not provided, 6 pages.

"The Effecgts of the Stress Dependence of Atomic Diffusivity on Stress Evolution Due to Electromigration", Young Joon Park and Carl V. Thompson, J. Appl. Phys. 82 (9), Nov. 1, 1997, pp. 4277–4281.

"A Hierarchical Reliability Analysis for Circuit Design Evaluation", S. P. Riege, C. V. Thompson and J. J. Clement, IEEE Transactions on Electron Devices, vol. 45, No. 10, Oct. 1998 4 pgs.

"The Effects of Microstructural Transitions at Width Transitions on Interconnect Reliability", C. S. Hau–Riege and C. V. Thompson, American Institute of Physics, 2000 pp. 8467–8472.

* cited by examiner

Primary Examiner—Kamand Cuneo
Assistant Examiner—Jimmy Nguyen
(74) Attorney, Agent, or Firm—Eschweiler & Associates, LLC

(57) ABSTRACT

A system and method is disclosed for determining a barrier permeability at a via. A test structure is formed having a test barrier between two conductors. A substantially constant current is conducted through the test structure to measure the lifetime of the test structure. A barrier permeability value is assigned to the test barrier of the test structure based on the measured lifetime. The system also includes a test structure having a first conductor, a second conductor forming an interconnect, a no-flux barrier substantially impermeable to mass flux between the first and second conductor, a third conductor, and a test barrier between the second and third conductor, to be assessed for the barrier permeability value. A current source supplies the current through the test structure. A timer measures the lifetime of the test structure, and a processor determines the value of barrier permeability $\alpha$ of the test barrier based on the measured lifetime of the test structure.

33 Claims, 8 Drawing Sheets

METHODOLOGY FOR AN ASSESSMENT OF THE DEGREE OF BARRIER PERMEABILITY AT VIA BOTTOM DURING ELECTROMIGRATION USING DISSIMILAR BARRIER THICKNESS

FIELD OF INVENTION

The present invention relates generally to test methods used in integrated circuit manufacturing. More particularly, the present invention relates to test methods for determining a value of barrier permeability associated with a test barrier at a via bottom based on a measured lifetime of a test structure containing the test barrier.

BACKGROUND OF THE INVENTION

As interconnect dimensions scale to smaller sizes and current densities increase in today's integrated circuits, the reliability of interconnects becomes a greater concern due to increased electromigration rates. Electromigration (EM), which is the diffusion of atoms in an interconnect induced by an electric current, can lead to interconnect failure by voiding or extrusion at sites of atomic flux divergence, that is, where the net flux of atoms is not zero. The net displacement of atoms during EM causes local stress changes in the interconnect in which either tensile or compressive stresses develop as atoms are depleted or accumulated, respectively. Tensile and compressive stresses can develop, for example, at the electron-source (cathode) and the electron-sink (anode) vias, respectively, when the vias are no-flux boundaries, such as W- or Ti-filled vias. Failure of the interconnect will occur, for example, once the stress somewhere in the line exceeds a critical stress required for void nucleation.

One of the purposes of a barrier layer is to prevent mass flow (diffusion of atoms) between the metal layers and the resultant interconnect failures due to electromigration. As device sizes continue to shrink, barrier materials must become thinner in order to minimize resistance at the vias. However, the thinning of the barrier may cause the interface of the via/feeder-line to become permeable to mass flux and lead to EM failures.

FIG. 1A illustrates a cross-sectional view of a two metal layer interconnect structure 100 having a first conductor 105, a second conductor 110, a third conductor 115, respectively. A barrier layer 120 is disposed between the first conductor 105 and the second conductor 110 at a cathode via 125 and disposed between the second conductor 110 and the third conductor 115 at an anode via 130. The second conductor 110, having a length L 135, forms an interconnect between the first and third conductors. Length L 135, is measured from the via at one end of the interconnect line to the via at the other end. FIG. 1A also illustrates the tensile stresses 140 which can develop in the region of the cathode via 125, and the compressive forces 145 which can develop in the region of the anode via 130 as electrons flow from the cathode to the anode. Typically, the layers may be formed, for example, using conductors of Al, Al alloy, with a TiN barrier layer, or using Cu conductors, with a TaN barrier layer.

FIG. 1B shows a cross-sectional view of another two metal layer interconnect structure 150 similar to the structure 100 illustrated in FIG. 1A. FIG. 1B illustrates a common failure mode due to voids 160 which typically form in areas of the highest tensile stresses (e.g., 140 of FIG. 1A), near the region of the cathode via 125. Mass flux-divergence taking place at the electron-source (cathode) vias, produces maximum tensile stresses in this region. When these tensile forces reach a critical stress level, void nucleation occurs. Eventually, if a high enough current density is maintained through the interconnect, failure of the interconnect may result due to electromigration (EM failure).

FIGS. 1A and 1B also illustrate the conventional EM test structures which attempt to determine the lifetime of such structures, to analyze the effects of EM on various structures, or the effect of a barrier layer on EM. In the conventional method, current is conducted from the cathode conductor to the anode conductor until the resistance of the test structure reaches a predetermined failure criterion. Conventional methods measure the lifetime of the test structure, or may even indicate improved or worsened lifetimes, but do not quantify a specific barrier parameter associated with the structure's lifetime.

In addition, conventional two-level EM test structures often have feeder lines that are much wider than the test line and therefore are insensitive to the permeability of the barrier at the via since mass flow from the feeder line to the via is negligible when compared to the volume of the feeder line.

Currently, some conventional EM test structures rely on an assumption that a barrier layer being tested has no mass flux entering from the cathode/feeder line, but may in fact, have a mass flux which may reduce or invalidate the effectiveness of testing lifetime measurements associated with specific parameters of the barrier which are under investigation.

Accordingly, there is a need for quantifying a specific barrier layer parameter associated with the lifetime of a test structure during electromigration in a test structure.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The invention is directed to a method of determining a barrier permeability, wherein a barrier permeability value is assigned to a test barrier based on a measured lifetime of a test structure used in integrated circuit manufacturing.

In the present invention a new EM test structure is also proposed in order to not only detect the permeability of a barrier/via, but also to allow for the quantifying of the degree of permeability, herein symbolized as ($\alpha$). According to one aspect of the invention, this may be accomplished using experimental lifetimes from different barrier permeability structures and by EM simulation.

The new EM test structure allows for the assessment of barrier permeability $\alpha$ at the via/supply-line barrier interface. The new test structure also assures the prevention of mass flux through the barrier from, for example, the cathode via of the test line, by providing a no-flux barrier (flux blocking boundary) at the cathode end of the test line. This no-flux barrier guarantees that a void will not form beyond the test line, via, or supply line. Such a boundary may be formed, for example, by depositing a much thicker barrier in the test line, while depositing the barrier of interest in the supply line.

The present invention provides a method for determining the magnitude (e.g., degree, extent) of permeability of a barrier at a via. A test structure is formed having a test barrier between two conductors. A substantially constant current is conducted through the test structure while measuring the time to failure (lifetime) of the test structure. A barrier permeability value is assigned to the test barrier of the test structure based on the measured lifetime.

In an aspect of the present invention, a processor or computer simulator, for example, may be provided to supply simulation lifetime data which is generally associated with the test structure. The simulator; for example, matches a measured lifetime $t_{REAL}$ to a simulation lifetime $t_{SIM}$. The method then assigns a barrier permeability value to the test barrier from a simulation lifetime permeability $\alpha_{SIM}$ corresponding to the simulation lifetime $t_{SIM}$ which is based on the measured lifetime $t_{REAL}$. The measured lifetime $t_{REAL}$ may be any value of time, based on the actual measured time until a failure of the test structure is determined.

Another aspect of the present invention further provides a method wherein, a second test structure is provided. The second test structure comprises a first conductor, a second conductor, wherein the second conductor forms an interconnect, and a third conductor, respectively. A first no-flux barrier is disposed between the first and second conductor, and a second no-flux barrier is disposed between the second and third conductor, wherein the first and second no-flux barrier are substantially impermeable to mass flux, and are substantially identical to the no-flux barrier of the first test structure. The exemplary method conducts a current through the second test structure, while measuring a lifetime of the second test structure, to confirm whether the no-flux barrier of the first test structure is substantially impermeable to mass flux based on the lifetime of the second test structure.

For example, the second test structure may have a much thicker barrier disposed between the first and third conductors, or a different material and thickness by which mass flux is prevented from traveling from the cathode end. The first and second no-flux barriers of the second test structure are intended to be substantially identical to the no-flux barrier of the first test structure, to test verify that the no-flux barrier of the first test structure is truly impermeable to mass flux.

In another example of the present invention, the system includes a test structure having a first conductor, a second conductor forming an interconnect, and a no-flux barrier substantially impermeable to mass flux between the first and second conductor. The structure further comprises a third conductor and a test barrier disposed between the second and third conductor, to be assessed for the barrier permeability value. A constant current source, for example, supplies the current through the test structure. A timer measures the lifetime of the test structure, and a processor determines the value of barrier permeability $\alpha$ of the test barrier based on the measured lifetime of the test structure.

Yet another exemplary aspect of the present invention provides a system, wherein the timer further comprises a detector to measure a change of resistance of the test structure, wherein a time to failure of the test structure is measured while measuring a change of resistance of the test structure. For example, the time at which the resistance of the test fixture changes from an initial resistance by some predetermined percentage may be used to determine that the test structure has failed, thereby defining the lifetime of the test structure.

The aspects of the invention find application in devices which include semiconductors, integrated circuits, and the manufacturing of such devices.

To the accomplishment of the foregoing and related ends, the invention comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1A:
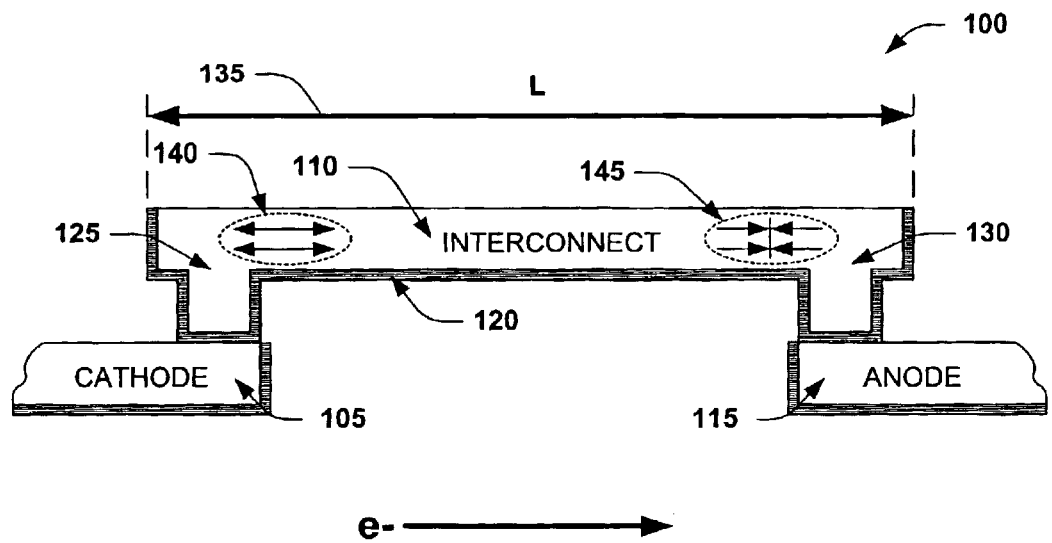
FIG. 1A is a cross-sectional view of a conventional metal interconnect of a conventional test structure, illustrating tensile and compressive stresses produced near vias during electromigration.
Figure 1B:
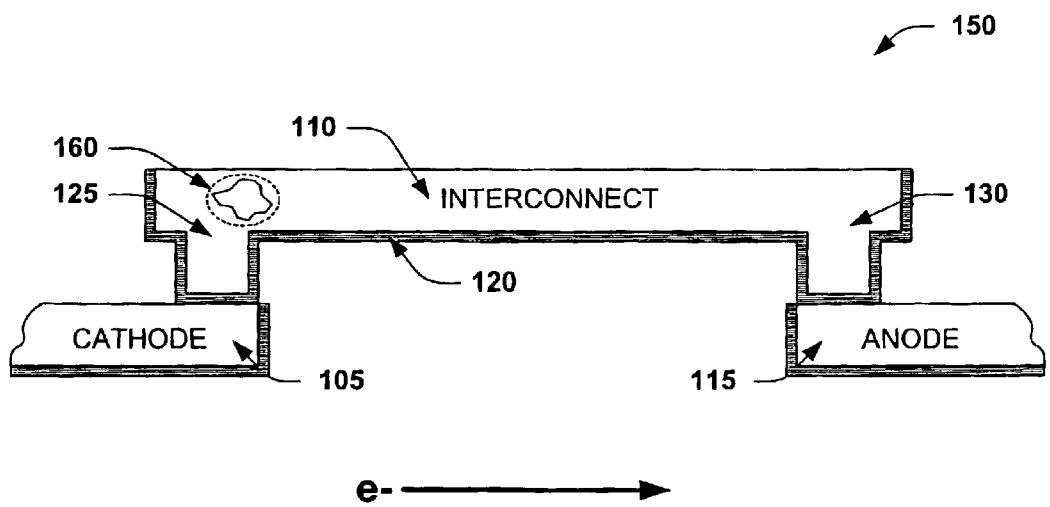
FIG. 1B is a cross-sectional view of a conventional metal interconnect of a conventional test structure, illustrating mass flux induced voiding produced by tensile stresses at the cathode via during electromigration.

The present invention will now be described with reference to the drawings, wherein like reference numerals are used to refer to like elements throughout. The present invention relates to a test method and system used in integrated circuit manufacturing for determining the value of barrier permeability associated with a test barrier at a via bottom based on a measured lifetime of a test structure containing the test barrier. The method provides a test structure having a test barrier which is tested, and a magnitude value is assigned thereto which reflects a degree of barrier permeability (herein symbolized as ($\alpha$)) at the via/supply-line barrier interface. A test structure is formed having a test barrier disposed between a first and second conductor, thru which a current is passed in order to measure a lifetime of the test structure. The measured lifetime of the test structure is then used to determine and assign a value (e.g., the magnitude) of the permeability of the test barrier.

Current test methods and EM test structures may seek to determine the lifetime of such structures, to analyze the effects of EM on various structures and the effect of a barrier layer on EM, or may even indicate improved or worsened lifetimes, but do not attempt to actually quantify the permeability of a barrier layer associated with the lifetime of the structure.

The present invention seeks to define a measurement of permeability, as stated above for $\alpha$, to provide a test structure which enables a measurement of the permeability of a test barrier (layer) during EM while eliminating the effects of mass flux from the cathode feeder-line, and to provide a testing methodology for assigning a permeability value to the test barrier within the test structure based on the measured lifetime of the structure.

Figure 2:
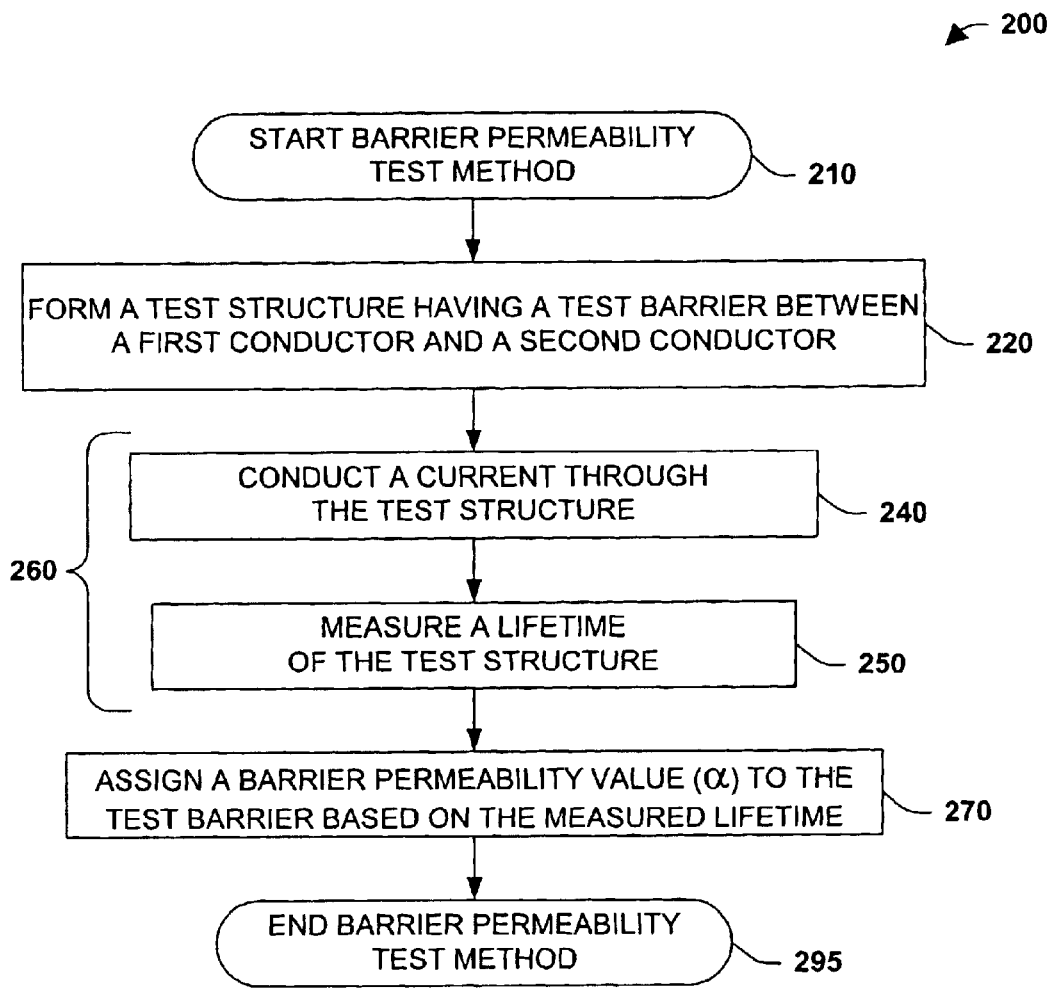
FIG. 2 is a flow diagram illustrating an exemplary method for ascertaining a barrier permeability in association with an aspect of the present invention.

An aspect of the present invention provides a methodology for determining a magnitude of permeability of a barrier in an integrated circuit device, which may be employed in association with the test structures illustrated and described herein, as well as with other test structures. Referring to FIG. 2, an exemplary test method 200 is illustrated in association with an aspect of the present invention. While the exemplary method 200 is illustrated and described herein as a series of acts or events, it will be appreciated that the present invention is not limited by the illustrated ordering of such acts or events, as some steps may occur in different orders and/or concurrently with other steps apart from that shown and described herein, in accordance with the invention. In addition, not all illustrated steps may be required to implement a methodology in accordance with the present invention. Moreover, it will be appreciated that the method 200 may be implemented in association with the apparatus and systems illustrated and described herein as well as in association with other systems not illustrated.

The method 200 comprises forming a test structure having a test barrier between two conductors at a via, conducting a current through the test structure, measuring a time to failure (lifetime) of the test structure. A barrier permeability value is then assigned to the test barrier of the test structure, based on the measured lifetime.

The barrier permeability test method begins at 210. At 220 a test structure is formed having a test barrier between a first conductor and a second conductor at a via. At 240, a current (e.g. a substantially constant current from a constant current source) is conducted through the test structure, wherein electrons flow from the first conductor through the test barrier and into the second conductor. The lifetime of the test structure is measured at 250, for example, by identifying a time period at which a predetermined change of resistance from an initial value of the test structure occurs.

Figure 3:
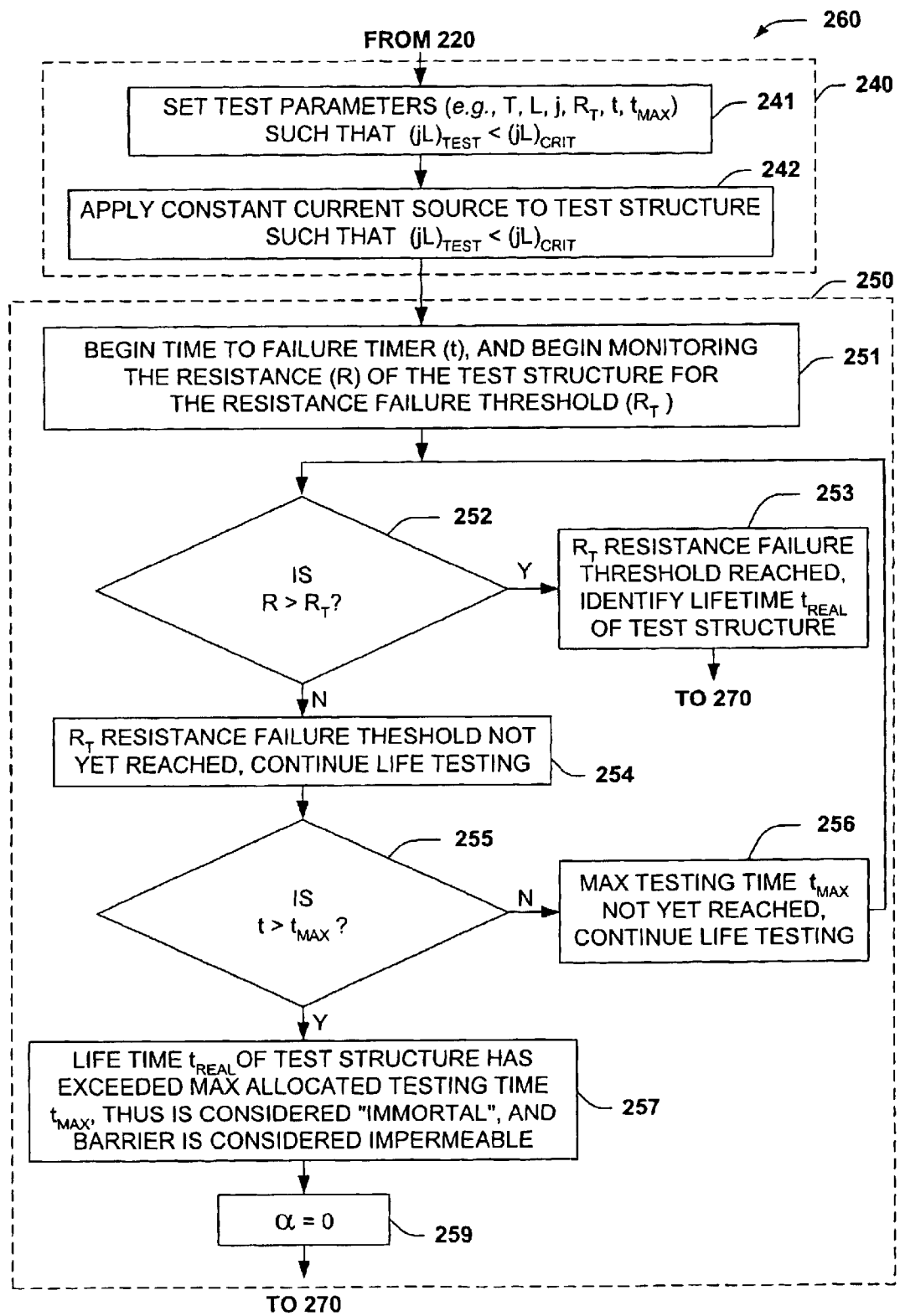
FIG. 3 is a flow diagram illustrating further details of the exemplary barrier permeability test method of FIG. 2 in association with an aspect of the present invention.

For example, FIG. 3 is a flow diagram 260 which further details 240 and 250 of the exemplary barrier permeability test method of FIG. 2 in association with an aspect of the present invention. Referring to FIG. 3, flow diagram 260 details in 240 the setting of several basic test parameters, whereby the current conduction may be established and the test structure may be life tested. For example, at 241, the temperature T of the test is established and set to a stable value which may be an elevated temperature for an accelerated life test.

A test product $(jL)_{TEST}$ of the length L of an interconnect (test line) within the test structure along with the current density j flowing through the interconnect may also be established at 241 such that the product of the two variables remains below a critical product $(jL)_{CRIT}$. The critical product $(jL)_{CRIT}$ in one example is defined as the critical Blech length, wherein the product of the two variables provides a balance between an electron wind force and a back stress force, ensuring that the interconnect will be substantially immortal to EM failure. The point here is, a test product $(jL)_{TEST}$ less than the critical product $(jL)_{CRIT}$ will thus, also be substantially immortal to EM failure.

Also, at 241 a predetermined resistance threshold $R_T$ may be established at which point the resistance R of the test structure will have changed by a predetermined percentage from an initial resistance (e.g., $R_T=R_{INITIAL}+\Delta R$). 241 also establishes a time t which will be measured for a time to failure of the test structure which is the measured lifetime $t_{REAL}$, or until a predetermined maximum allowable testing time $t_{MAX}$ has been reached. At 242, the substantially constant current is applied to the test structure such that $(jL)_{TEST}<(jL)_{CRIT}$.

The lifetime of the test structure is measured at 250, and proceeds at 251, wherein a time to failure timer t is begun, while the resistance R of the test structure is monitored for the predetermined resistance failure threshold $R_T$. At 252 a determination is made whether the resistance R of the test structure has reached the predetermined failure threshold $R_T$. If the resistance of the test structure has reached $R_T$, then the measured lifetime of the test structure is identified as $t_{REAL}$ at 253, and the test method proceeds back to 270 of FIG. 2.

Otherwise, if the resistance of the test structure has not reached $R_T$, then the lifetime of the test structure has also not been reached, as identified by 254, and testing continues to 255 of FIG. 3. At 255 a determination is made whether the time t of the testing has reached the predetermined maximum allowable testing time $t_{MAX}$. If the maximum allowable testing time $t_{MAX}$ has been reached while the resistance is still less than $R_T$, then the measured lifetime of the test structure is identified as $t_{MAX}$ at 257 and is therefore considered substantially immortal to EM failure. As the test structure is considered substantially immortal to EM failure, the permeability of the test barrier is considered impermeable and is identified as $\alpha=0$ at 259, and the test method proceeds back to 270 of FIG. 2.

Otherwise, if the maximum allowable testing time $t_{MAX}$ has not been reached, while the resistance is still less than $R_T$, then the lifetime testing continues to 256, which then continues back to the resistance determination at 252 of FIG. 3.

Thereafter, referring back to FIG. 2, a barrier permeability value $\alpha$ is assigned to the test barrier of a test structure at 270 based on the measured lifetime of the test structure. In one example, the barrier permeability value a represents the fraction of the atomic flux associated with the test barrier compared to a completely permeable boundary, which may be used for various barrier evaluations and integrated circuit manufacturing operations. The operation thereafter ends at 295, and the method 200 may be repeated for subsequent barrier permeability tests of additional test structures.

Optionally, the method 200 may be expanded to include the use of a processor or computer type simulator, for example, to supply simulation lifetime data which is generally associated with the test structure. The simulation lifetime data may be, for example, in the form of a plot, or look-up table correlating a simulated lifetime $t_{SIM}$ to a simulation lifetime permeability $\alpha_{SIM}$. The method 200 then optionally include, for example, receiving the simulation lifetime data which is generally associated with the test structure, and matching the measured lifetime $t_{REAL}$ of the test structure to the simulation lifetime $t_{SIM}$ from the simulation lifetime data, and assigning a barrier permeability value to the test barrier from a simulation lifetime permeability $\alpha_{SIM}$ corresponding to the simulation lifetime $t_{SIM}$ based on the measured lifetime $t_{REAL}$ of the test structure.

Figure 4:
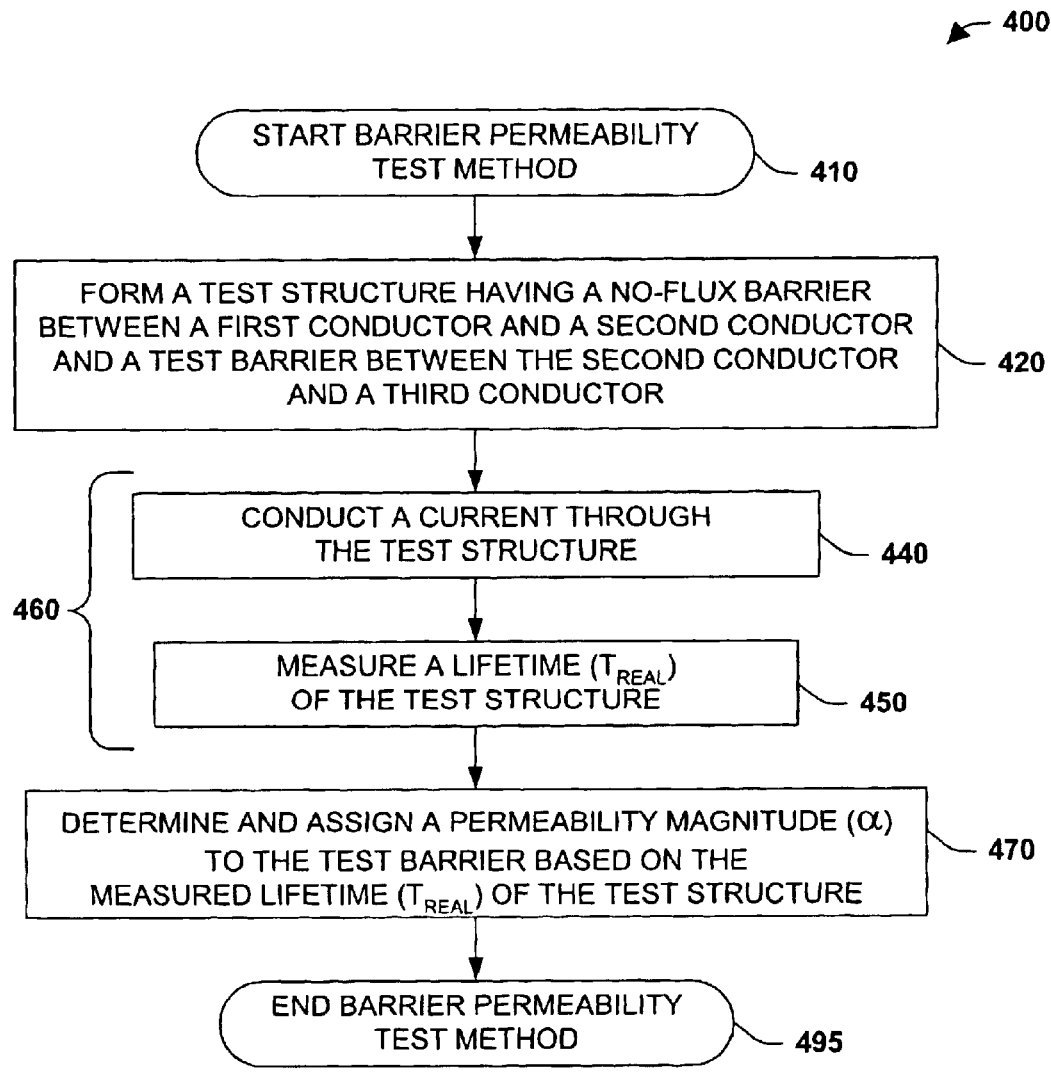
FIG. 4 is a flow diagram illustrating exemplary method for ascertaining a barrier permeability in association with another aspect of the present invention.

Referring to FIG. 4, another exemplary test method 400 is illustrated for a barrier permeability test method in a test structure in association with an aspect of the present invention. The exemplary EM test structure allows for the assessment of barrier permeability $\alpha$ at the via/supply-line barrier interface. The test structure also assures the prevention of mass flux through the barrier from the cathode via of the test line, by providing a no-flux barrier (flux blocking boundary) at the cathode end of the test line. This no-flux barrier guarantees that a void or extrusion will not form beyond the test line, via, or supply line. Such a boundary may be formed, for example, by depositing a much thicker barrier in the test line via, while depositing the barrier of interest in the supply line via.

The method 400 of FIG. 4 comprises forming a test structure having a no-flux barrier between a first conductor and a second conductor within a via, wherein the second conductor forms an interconnect, and a test barrier between the second conductor and a third conductor within a via The method 400 further comprises conducting a current through the test structure and measuring a time to failure (lifetime) of the test structure. A barrier permeability value is then assigned to the test barrier of the test structure based on the measured lifetime. The test method proceeds similar to that of the method described in FIGS. 2 and 3, except that another exemplary test structure is used in the method, and as such, the common areas of the method need not be described again.

The barrier permeability test method begins at step 410. At 420 a test structure is formed having a no-flux barrier between a first conductor and a second conductor, and a test barrier between the second conductor and a third conductor at a via. At 440, a current (e.g., a substantially constant current from a constant current source) is conducted through the test structure, wherein electrons flow from the first conductor through the no-flux barrier to the second conductor forming an interconnect, through the test barrier and into the third conductor. The lifetime of the test structure is measured at 450, for example, by looking for a predetermined change of resistance from an initial value of the test structure, as described in the flow diagram 260 of FIG. 3.

Thereafter, referring back to FIG. 4, a barrier permeability value $\alpha$ is assigned to the test barrier of a test structure at 470 based on the measured lifetime of the test structure. The operation thereafter ends at 495, and the method 400 may be repeated for subsequent barrier permeability tests of additional test structures.

Optionally, the method 400 and as described in the method 200 may also be expanded to include the use of a processor or computer type simulator, for example, to supply simulation lifetime data which is generally associated with the test structure for assigning a barrier permeability value to the test barrier from a simulation lifetime permeability $\alpha_{SIM}$ corresponding to the simulation lifetime $t_{SIM}$ based on the measured lifetime $t_{REAL}$ of the test structure. The methodology 400 thus provides a test method to determine the barrier permeability of a test structure and assign a barrier permeability value $\alpha$ to the test barrier of a test structure based on the measured lifetime of the test structure.

Another aspect of the present invention further provides a method wherein, a second test structure is provided. The second test structure comprises a first conductor, a second conductor, wherein the second conductor forms an interconnect, and a third conductor, respectively. A no-flux barrier is disposed between the first and second conductor, and also between the second and third conductor, wherein the no-flux barrier is substantially impermeable to mass flux, and is substantially identical to the no-flux barrier of the first test structure. Further, the second conductor length and cross-sectional area of the first and second test structures are also substantially identical. The exemplary method comprises conducting a current through the second test structure, while measuring a lifetime of the second test structure, and confirming whether the no-flux barrier of the first test structure is substantially impermeable to mass flux based on the lifetime of the second test structure, which is substantially identical to the no-flux barrier of the first test structure. If the impermeability of the no-flux barrier is confirmed, then one can be more certain that a failure of the first structure is due to the permeability of the test barrier associated therewith.

For example, the second test structure may have a much thicker no-flux barrier disposed between the first and third conductors, or may use different material and a different thickness by which mass flux is prevented from traveling from the cathode end. Regardless of the scheme used to produce the no-flux barrier, the no-flux barrier of the second test structure is intended to be substantially identical to the no-flux barrier of the first test structure, to test verify that the no-flux barrier of the first test structure is truly impermeable to mass flux.

Figure 5:
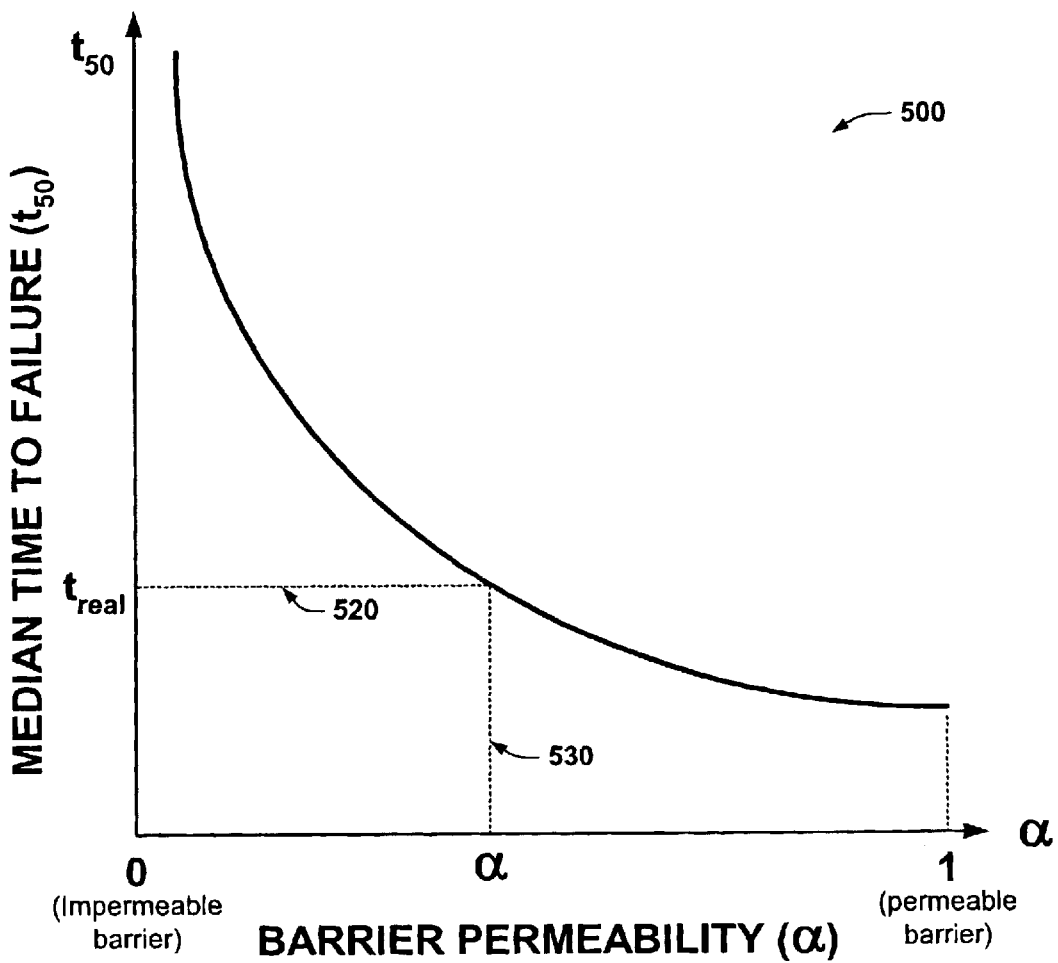
FIG. 5 is an exemplary plot of the median time to failure vs. barrier permeability $\alpha$ relationship of an EM test structure in accordance with an aspect of the invention.

FIG. 5 is a plot 500 illustrating, in one example, the median time to failure vs. barrier permeability $\alpha$ relationship of an EM test structure in accordance with an aspect of the invention. The permeability $\alpha$ has been characterized in one example as the fraction of the atomic flux of the barrier under evaluation compared to a completely permeable boundary. As such, the permeability $\alpha$ of a barrier in the present example ranges from 0 to 1, wherein an impermeable barrier is represented by 0, and a completely permeable barrier is represented by 1. An impermeable barrier ($\alpha$=0) prevents mass flow through a boundary between the associated conductors, while a completely permeable barrier ($\alpha$=1) allows full atomic flux through the boundary between the associated conductors. For example, two conductors in direct contact without a barrier would closely represent a completely permeable barrier ($\alpha$=1), while a very thick barrier layer, or a tungsten plug may closely represent an impermeable barrier ($\alpha$=0).

Although exemplary range boundary values of 0 to 1 have been used for barrier permeability, other values may also be used to represent barrier permeability, for example, 0 to 100%, A to Z, or another range of values, wherein a metric of a magnitude value is provides which may be assigned to a barrier to reflect a degree of barrier permeability.

These characterizations of permeability and its range from an impermeable barrier ($\alpha$=0), to the completely permeable barrier ($\alpha=1$), set forth the theoretical boundaries of permeability. However, the real world teaches that neither extreme of permeability ($\alpha=0$, or 1), is likely to be fully achieved, wherein an impermeable barrier completely prevents every atom of mass flux, nor a completely permeable barrier completely allows mass flow passage of every atom. Further, the practical limits of lifetime testing, certainly cannot allow a true lifetime of testing to achieve the correlations made between a measured lifetime of a test structure and the permeability of a barrier. Therefore, within the context of the present invention, the boundaries of permeability discussed will generally relate to those achieved within predetermined testing limits.

For example, the predetermined limit $R_T$ for the change of resistance of the test structure provides an acceptable testing limit, without having to wait indefinitely, yet achieving a practical EM failure criteria for determining the measured lifetime $t_{REAL}$ 520. The maximum allowable testing time limit $t_{MAX}$ used in the methods of the present invention, also provides an acceptable maximum life testing time for the test structure, when operated at a predetermined temperature and at a predetermined current density, by which time an experimental population of test structures will have demonstrated an acceptable distribution of measured lifetimes. FIG. 5 further illustrates a plot 500 of the results of such an experimental lifetime test on a population of test structures, and illustrates an exemplary measured lifetime $t_{REAL}$ 520 which correlates to a barrier permeability $\alpha_{REAL}$ 530.

Thus within the context of the present invention, a test structure which did not fail during the measured lifetime test, has not exhibited the predetermined resistance change within the maximum allowable testing time. Therefore the test structure is considered to be immortal to EM failure and have an impermeable barrier (e.g., a no-flux barrier), wherein a permeability value of ($\alpha=0$) is assigned to the barrier. By contrast, a test structure which failed during the measured lifetime test at $t_{REAL}$ 520, has exhibited the predetermined resistance change within the maximum allowable testing time. Therefore the test structure is considered to be mortal to EM failure and have a permeable barrier, wherein a permeability value of $\alpha_{REAL}$ 530 is assigned to the barrier based on the measured lifetime $t_{REAL}$ 520.

Conventional simulations (e.g., the MIT/EmSim) of test structures closely associated with a selected test structure, have also been shown to reasonably predict the lifetime of an interconnect of a given test structure, and may be used in the assessment of barrier permeability. Thus, simulations may be used to create a simulation results plot similar to that of FIG. 5. Therefore, a median time to failure (lifetime) may be experimentally determined and used as a basis in a simulation to predict a permeability value $\alpha$. Such a plot 500 may be constructed using any number of different types of EM models and all such models are contemplated as falling within the scope of the present invention.

For example, assume an exemplary EM test structure is life tested and produces a measured lifetime $t_{REAL}$. A simulation may be created which is generally associated with the exemplary test structure and plots the relationship data between a simulation lifetime $t_{SIM}$ vs. a simulation barrier permeability $\alpha_{SIM}$ relationship of the exemplary test structure.

Then the measured lifetime $t_{REAL}$ may be matched or otherwise correlated to the simulation lifetime $t_{SIM}$ which then corresponds to the simulation barrier permeability $\alpha_{SIM}$ based on the measured lifetime $t_{REAL}$ of the exemplary test structure.

For example, if the exemplary test structure and associated simulation provided the following data:

| $t_{REAL}$ | $t_{SIM}$ | $\alpha_{SIM}$ |
|---|---|---|
| 40 hrs. | 40 hrs. | .8 |
| 100 hrs. | 100 hrs. | .6 |
| 200 hrs. | 200 hrs. | .5 |
| 400 hrs. | 400 hrs. | .4 |
| 600 hrs. | 600 hrs. | .2 |

Then, according to an aspect of the present invention, matching the measured lifetime $t_{REAL}$ to the simulation lifetime $t_{SIM}$ corresponding to the simulation barrier permeability $\alpha_{SIM}$, provides a barrier permeability value $\alpha$ which may be assigned to the test barrier based on the measured lifetime $t_{REAL}$ of the test structure. In another aspect of the invention, heating the test structure during the life testing provides accelerated lifetime test results.

Alternately, historical data from previous actual measured lifetime tests of a population of similar test structures may by used as a basis for the relationship data. The relationship data may take on the form of a look-up table, a plot, or any other scheme which provides data for the lifetime vs. $\alpha$ relationship.

The median time to failure may be symbolized by $t_{50}$, which is generally the median lifetime of attest structure. According to Black's equation:

$$t_{50}=Aj^{-n} \exp(E_A/kT)$$

where: A=current in Amps, j=current density, $E_A$=activation energy, k=Boltzman's constant, and T=temperature.

Figure 6:
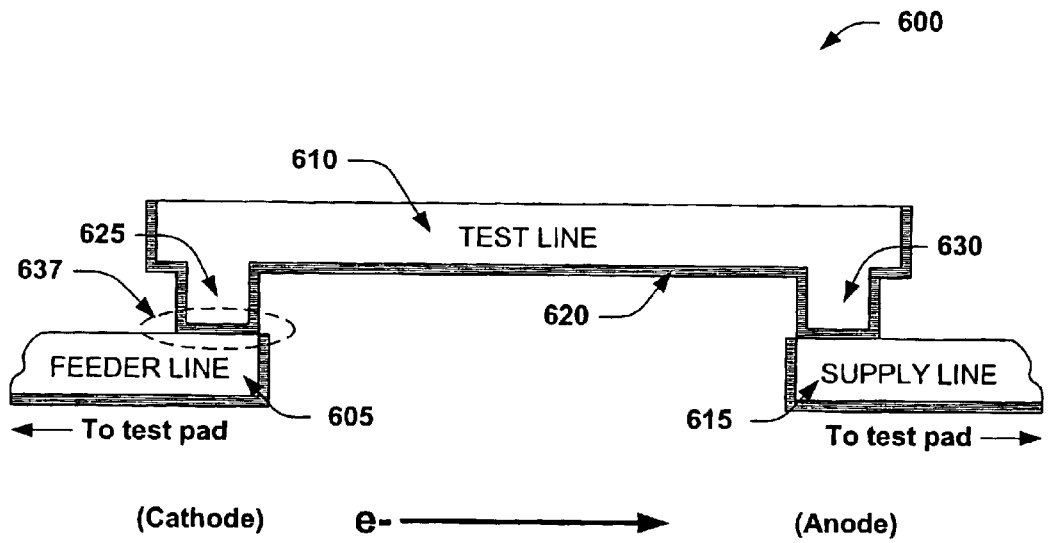
FIG. 6 is a cross-sectional view of a conventional test structure, illustrating connections and the current flow during an electromigration test.

FIG. 6 is a cross-sectional view of a conventional test structure 600, illustrating connections and the current flow during an electromigration test. The conventional test structure 600 of FIG. 6 is a two metal layer interconnect structure having a first conductor 605, a second conductor 610, a third conductor 615, and a barrier 620 disposed between the first conductor 605 and the second conductor 610 at a cathode via 625 and disposed between the second conductor 610 and the third conductor 615 at an anode via 630. The second conductor 610 forms an interconnect between the first and third conductors. Again, electrons are indicated as flowing from the cathode to the anode. FIG. 6 also illustrates a test area 637, in the region of the cathode via 625, which has substantially the same barrier layer and thickness as that of the region of the anode via 630.

The conventional test structure of FIG. 6 may rely on an assumption that the test structure being tested, has no mass flux entering from the cathode/feeder line, but may in fact, have a mass flux which may reduce or invalidate the effectiveness of testing lifetime measurements under investigation. Although, some conventional EM test methods or test structures may have attempted to determine the lifetime of such structures, to analyze the effects of EM on various structures,-the effect of a barrier layer on EM, or may have indicated improved or worsened lifetimes, they did not attempt to quantify the magnitude of the barrier permeability itself. Rather, upon lifetime testing, a barrier was deemed either to be sufficiently effective or not sufficiently effective without any further characterization of the barrier.

Figure 7:
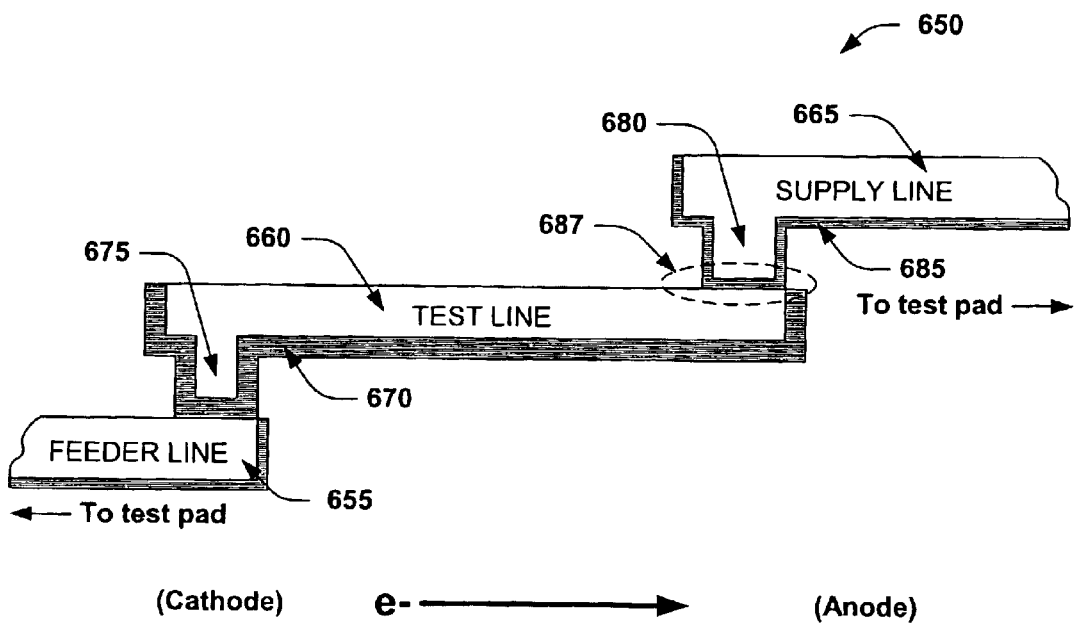
FIG. 7 is a cross-sectional view of an exemplary test structure, illustrating a no-flux barrier, a test barrier, connections and current flow during an electromigration lifetime test for assigning a permeability value to the test barrier in accordance with an aspect of the invention.

FIG. 7 is a cross-sectional view of an exemplary test structure 650 in accordance with an aspect of the invention. The structure 600 includes a no-flux barrier, a test barrier, and connections and current flow illustrated during an electromigration lifetime test.

The exemplary test structure 650 of FIG. 7 comprises a first conductor 655, a second conductor 660, and a third conductor 665. The test structure 650 further comprises a no-flux barrier 670 disposed between the first conductor 655 and the second conductor 660 at a cathode via 675, and a test barrier 685 disposed between the second conductor 660 and the third conductor 665 at an anode via 680. The test barrier 685 is then tested and is assigned a barrier permeability value, based on a measured lifetime. The first conductor 655 functions as a cathode feeder-line, while the second conductor 660 forms an interconnect (test line) between the first and third conductors. Lastly, the third conductor 665 functions as an anode supply line. Again, electrons are indicated as flowing from the cathode to the anode and reflect current flow through the test structure 650. FIG. 7 also illustrates a test area 687 having the test barrier 685 at the anode via 680 with a substantially different barrier or thickness than that of the no-flux barrier 670 at the cathode via 675. Therefore in the present example, the no-flux barrier 670 and the test barrier 685 are the same material, but differ in that the no-flux barrier 670 is substantially more thick to substantially ensure no mass flux therethrough.

During a barrier permeability testing operation of the exemplary test structure 650 of FIG. 7, a substantially constant current is conducted through the test structure 650, in order to measure a time to failure (measured lifetime $t_{REAL}$) of the test structure 650. A barrier permeability value α is then determined and assigned to the test barrier of the test structure, based on the measured lifetime $t_{REAL}$.

The system of the present invention provides a no-flux barrier 670 at the cathode via 675 for eliminating the effects of mass flux from the first conductor (cathode feeder-line) 655. Such a no-flux barrier 670 (boundary) can be formed by depositing, for example, a much thicker barrier or another barrier material associated with the test line 660, while depositing the barrier of interest in the supply line 665. Alternately, a tungsten plug or other substantially impermeable conductive material may be used as a no-flux barrier. The no-flux barrier at the cathode via 675 effectively prevents mass flux from the cathode feeder-line flowing into the interconnect, thereby isolating the interconnect from any unwanted damage or benefit from this source and eliminating a source of testing contamination to the lifetime measurement. In contrast to the conventional two-level EM test structures which are desensitized to barrier permeability by the use of wider feeder lines, the no-flux barrier 670 is particularly beneficial to prevent this mass flux and testing contamination, regardless of feeder line width.

In addition, a carefully chosen combination of the test line (interconnect) length L and the current density j provides a test structure which is otherwise immortal to EM failure. The reasoning for this is as follows: under certain conditions, a line may be considered immortal to EM failure; that is, it may never fail due to EM under these conditions. Shortening the interconnect line is a well known way to achieve immortality. The critical length below which the interconnect is immortal is denoted as $L_{CRIT}$ (a.k.a. the "critical Blech length") in the context of this invention. This assumes, however, that the barrier is impermeable. If the barrier were to become permeable, that line would fail even if the length is below the critical length value.

It should be noted at this point, however, that the term critical length or $L_{CRIT}$, is something of a misnomer, as the length of the interconnect itself is not all that determines immortality to EM failure. Rather, an interconnect of a test structure is said to become immortal to EM failure if the product (test product) of the interconnect length L and the current density j through the interconnect is less than a critical product, wherein $(jL)_{TEST} < (jL)_{CRIT}$. These conditions for interconnect immortality occur when there is a balance between an electron wind force and a back stress force. One force is in the direction of the electron flow, and is caused by electrons imparting their momentum on the metallic ions of the interconnect conductor. The second force is the back-stress which is in the opposite direction from the electron flow. Back-stress wants to move the metallic ions in the opposite direction from the electron flow. Thus it is believed that when the force from the electron flow is not equal to the force from the back-stress, mass flow takes place producing the voids in a conductor and ultimately EM failure.

The present invention combines these concepts into a test structure and testing methodology, wherein a magnitude of a barrier permeability of a test barrier may be quantified, for example, based on the following features and test conditions:

1. Utilizing a no-flux barrier at the cathode via eliminates the effects of mass flux from the cathode feeder-line to protect the interconnect.

2. Maintaining the test product less than the critical product, wherein $(jL)_{TEST} < (jL)_{CRIT}$ assures the interconnect will not fail.

3. Measuring the test structure lifetime using 1 & 2 above, ensures primarily only the magnitude of barrier permeability α affects the measured lifetime.

Figure 8A:
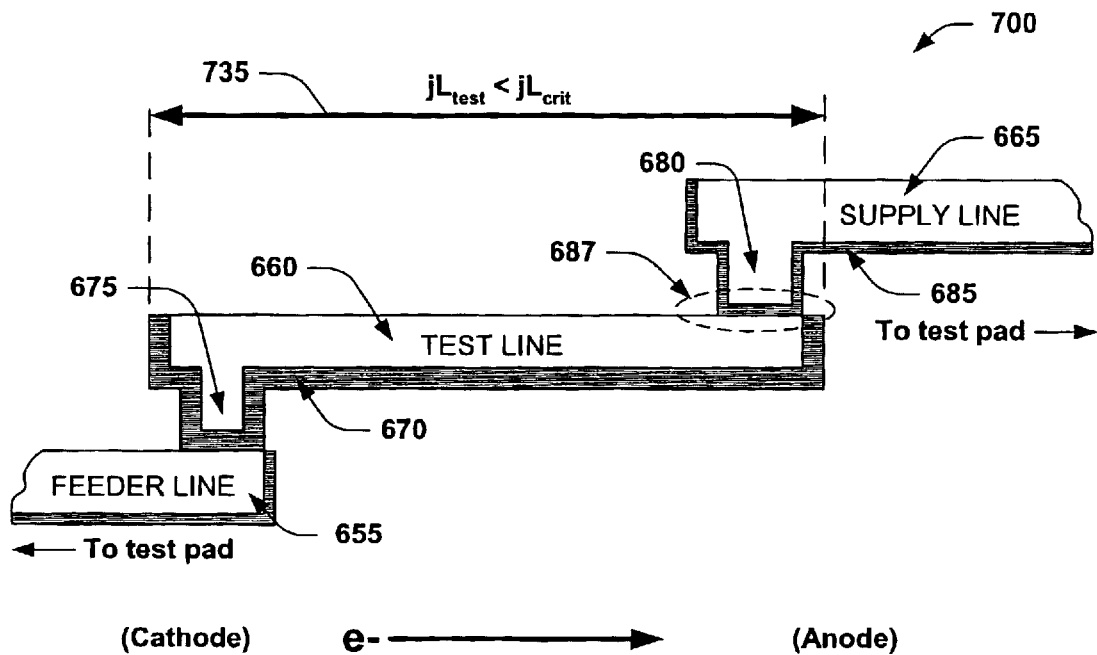
FIG. 8A is a cross-sectional view of the exemplary test structure of FIG. 7, illustrating a test structure design feature which facilitates assigning a permeability value to the test barrier in accordance with an aspect of the invention.

FIG. 8A is a cross-sectional view of an exemplary test structure 700, illustrating a no-flux barrier, a test barrier, connections and current flow during an electromigration lifetime test. The exemplary test structure 700 of FIG. 8A follows the same general description as that of FIG. 7, and therefore need not be described again, except for the addition of the test line length 735 of FIG. 8A, and its features.

Rather than identifying the physical length of an interconnect (test line) here as only a line length $L_{TEST}$ which must be less than a critical line length $L_{CRIT}$, as described above for FIG. 7, a better result is obtained by representing the test line length 735 as $(jL)_{TEST} < (jL)_{CRIT}$. As discussed, this takes into account the interconnect length L and the current density j through the interconnect, wherein the test product $(jL)_{TEST}$ must be less than the critical product $(jL)_{CRIT}$. The physical line length portion of the test line length 735 product is measured from the cathode via 675 to the anode via 680.

Figure 8B:
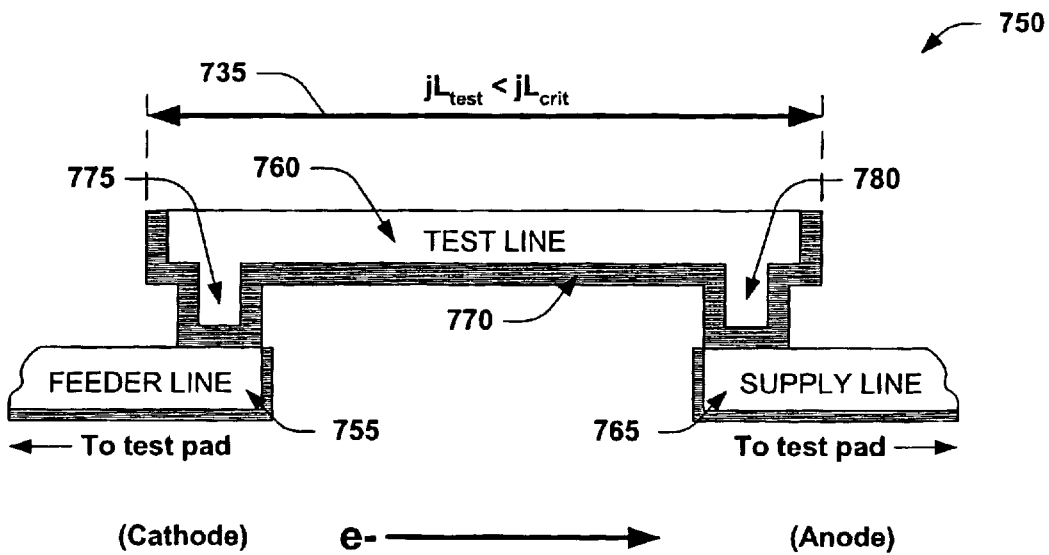
FIG. 8B is a cross-sectional view of an exemplary verification test structure, illustrating a no-flux barrier at both ends of the interconnect, connections and current flow during an electromigration lifetime test for verification of a no-flux barrier in accordance with an aspect of the invention.

FIG. 8B is a cross-sectional view of an exemplary verification (second) test structure 750, illustrating a no-flux barrier at both ends of the interconnect, connections and current flow during an electromigration lifetime test for verification of a no-flux barrier in accordance with an aspect of the invention. The exemplary verification test structure 750 of FIG. 8B is a two metal layer interconnect structure having a first conductor 755, a second conductor 760, and a third conductor 765. A no-flux barrier 770 is disposed between the first conductor 755 and the second conductor 760 at a cathode via 775 and also between the second conductor 760 and the third conductor 765 at an anode via 780. The second conductor 760 forms an interconnect between the first and third conductors. Again, electrons are indicated as flowing through the test structure from the cathode to the anode.

FIG. 8B further illustrates that the no-flux barrier 770 at the cathode via 775 and the anode via 780 is a substantially identical barrier to that of the no-flux barrier 670 at the cathode via 675 of FIG. 8A. Also, as with the test structure (the first test structure) of FIG. 8A, the verification test structure 750 of FIG. 8B, also has a test line length 735 represented as $(jL)_{TEST} < (jL)_{CRIT}$, wherein the lengths, cross-sectional area, and current density of the test lines of both test structures are substantially identical. The verification test structure 750 provides an optional structure whereby it may be verified (confirmed) that the no-flux barrier, in fact, prevents mass flux from the test structure of FIG. 8A which contains the actual test barrier 685 of the test area 687.

For example, to verify that a given no-flux barrier truly prevents flux for a test structure which is to be lifetime tested, a test structure and a verification test structure may be formed, wherein the test lines of both structures have substantially identical length, cross-sectional area, wherein $(jL)_{TEST} < (jL)_{CRIT}$, and wherein the test conditions (e.g., temp, current density, etc.) for both are substantially identical. The structures may be easiest to make substantially identical in these specific areas, if both structures are processed in the same metalization layer. Note, not all areas of both structures are made identical.

The verification (second) test structure, and optionally the test structure (the first test structure), is then EM lifetime tested for the no-flux barrier verification test. If the lifetime of the verification test structure is determined to be mortal (finite), then the no-flux barrier is permeable to mass flux and may be considered inadequate for the test structure. In this case, for example, the no-flux barrier may need to be made thicker, another barrier material selected, the test current reduced, or another variable changed in the barrier. Otherwise, if the lifetime of the verification test structure is determined to be substantially immortal, then the no-flux barrier is verified impermeable to mass flux for the test structure.

Thus, unlike a conventional test structure, an aspect of the present invention provides a test structure and method, wherein a magnitude of a barrier permeability of a test barrier may be quantified. The test structure utilizes a no-flux barrier at the cathode via to prevent mass flux contamination from the cathode feeder-line into the interconnect, wherein the no-flux barrier may be a substantially different thickness or barrier material than the test barrier. The test structure further includes a test barrier deposited in the supply line at a via between the interconnect and the anode supply-line, whereby the test barrier may be a substantially different thickness or barrier material than the no-flux barrier.

Figure 9:
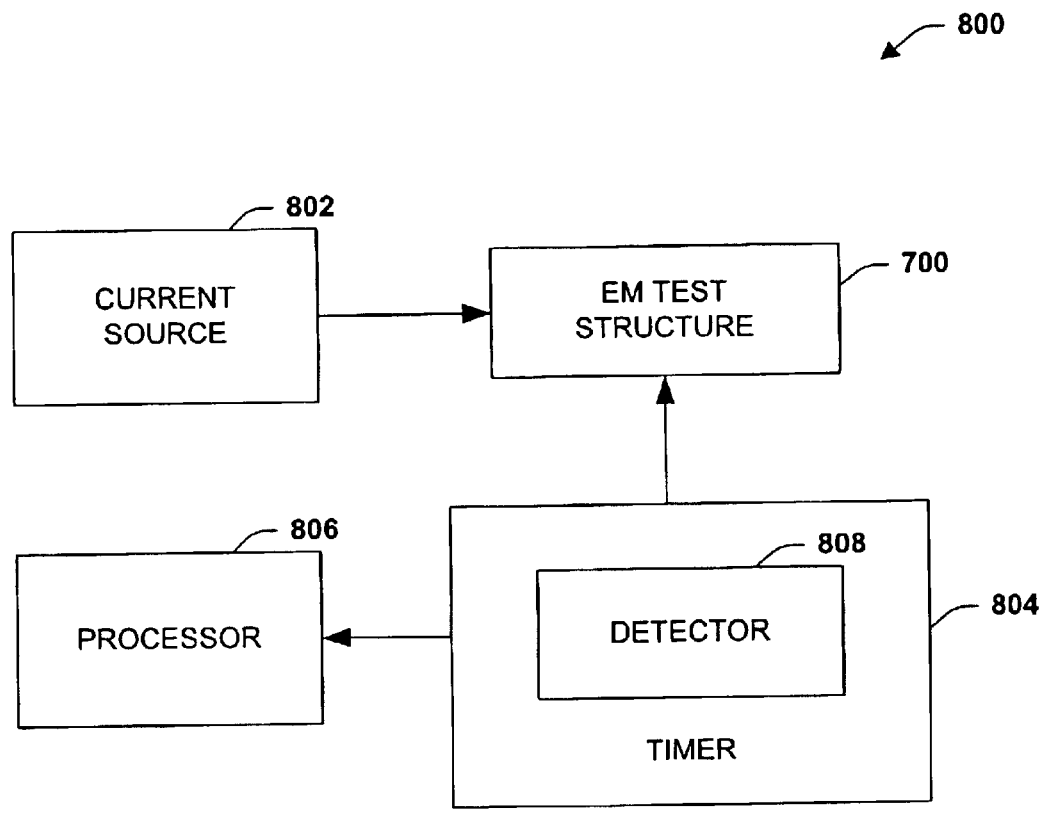
FIG. 9 is a block diagram illustrating a system for determining a permeability of a barrier associated with a test structure in accordance with another aspect of the present invention.

In another example of the present invention, as illustrated in FIG. 9, a system 800 includes a current source 802, for example, to supply a substantially constant current through the test structure (e.g., structure 700 of FIG. 8A). In a further example of the present invention, the system 800 includes a timer 804 operable to measure the lifetime of the test structure, and a processor 806 operable to determine the value of barrier permeability α of the test barrier based on the measured lifetime of the test structure.

Yet another exemplary aspect of the present invention provides a system, wherein the timer, further comprises a detector 808 to measure a change of resistance of the test structure 700, wherein a time to failure of the test structure is measured while measuring a change of resistance of the test structure. The time to failure, for example, may be determined as the time at which the resistance of the test structure changes from an initial resistance by some predetermined percentage, thus defining the test structures' lifetime.

Other variations of the exemplary test structure are contemplated as falling within the scope of the present invention, whereby a magnitude of a barrier permeability of a test barrier may be quantified for applications in devices which include semiconductors, integrated circuits, and the manufacturing of such devices.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc. ), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "includes" , "having", "has", "with", or variants thereof are used in either the detailed description or the claims, such terms are intended to be inclusive in a manner similar to the term "comprising."

What is claimed is:

1. A method of assessing a magnitude of a barrier permeability at a via bottom during electromigration in a test structure, comprising:
   providing the test structure, wherein the test structure comprises:
      a first conductor;
      a second conductor, wherein the second conductor forms an interconnect;
      a no-flux barrier disposed between the first and second conductor, wherein the no-flux barrier is substantially impermeable to mass flux;
      a third conductor; and
      a test barrier disposed between the second and third conductor, wherein the test barrier is to be assessed for the magnitude of barrier permeability;
   conducting a current through the test structure;
   measuring a lifetime of the test structure; and
   determining a permeability of the test barrier based on the measured lifetime of the test structure.

2. The method of claim 1, further comprising:
   providing a second test structure, wherein the second test structure comprises:
      a first conductor;
      a second conductor, wherein the second conductor forms an interconnect;
      a first no-flux barrier disposed between the first and second conductor;
      a third conductor; and
      a second no-flux barrier disposed between the second and third conductor, wherein the first and second no-flux barrier are substantially impermeable to mass flux, and are substantially identical to the no-flux barrier of the first test structure;
   conducting a current through the second test structure;
   measuring a lifetime of the second test structure; and
   confirming whether the no-flux barrier of the first test structure is substantially impermeable to mass flux based on the lifetime of the second test structure.

3. The method of claim 2, wherein confirming whether the no-flux barrier of the first test structure is substantially impermeable to mass flux based on the lifetime of the second test structure comprises:
    determining if the lifetime of the second test structure exceeds a predetermined lifetime threshold, then the no-flux barrier of the first test structure is determined to be substantially impermeable; and
    otherwise, if an electromigration failure occurs before the predetermined lifetime threshold, then the no-flux barrier of the first test structure is determined to be inadequately impermeable to mass flux based on the lifetime of the second test structure.

4. The method of claim 2, further comprising heating the test structure while conducting the current through the second test structure.

5. The method of claim 2, wherein conducting the current through the second test structure comprises providing a substantially constant current.

6. The method of claim 1, further comprising heating the test structure while conducting the current through the test structure.

7. The method of claim 1, wherein conducting the current through the test structure comprises providing a substantially constant current.

8. The method of claim 1, wherein measuring a lifetime of the test structure comprises measuring a time to failure of the test structure while measuring a change of resistance of the test structure.

9. The method of claim 8, wherein measuring a time to failure of the test structure while measuring a change of resistance of the test structure comprises determining a time at which the resistance of the test structure has changed by more than a predetermined percentage of an initial resistance.

10. The method of claim 9, wherein determining a time at which the resistance of the test structure has changed by more than a predetermined percentage of an initial resistance comprises:
    determining if a maximum testing time has been exceeded, wherein if the maximum testing time has been exceeded, the test barrier is considered impermeable; and
    otherwise continuing the time to failure testing until the test barrier resistance has changed by more than the predetermined percentage of the initial resistance, whereupon the interconnect is considered failed and the time to failure is identified.

11. The method of claim 1, wherein conducting a current through the test structure, comprises conducting a current through the test structure such that $(jL)_{TEST} < (jL)_{CRIT}$, wherein a test product of a current density and a length of the interconnect being tested, is less than a critical product of a current density and a length of the interconnect with a critical length.

12. The method of claim 11, wherein the critical length comprises a length of the interconnect wherein the product $(jL)_{TEST} < (jL)_{CRIT}$ provides a sufficiently small enough product to insure immortality to electromigration failure for the interconnect of the test structure, wherein the no-flux barrier is impermeable.

13. The method of claim 1, wherein determining a permeability of the test barrier based on the measured lifetime of the test structure comprises:
    receiving simulation lifetime data which is generally associated with the test structure, and correlating the measured lifetime of the test structure to a simulation lifetime from the simulation lifetime data; and
    assigning a magnitude of the permeability to the test barrier from a simulation permeability corresponding to the simulation lifetime based on the measured lifetime of the test structure.

14. The method of claim 1, wherein receiving simulation lifetime data which is generally associated with the test structure comprises lifetime data from a simulation lifetime results plot, wherein each simulation lifetime of the plot has a unique simulation permeability.

15. A system for assessing a magnitude of a barrier permeability at a via bottom during electromigration, comprising:
    a test structure, comprising:
        a first conductor;
        a second conductor, wherein the second conductor forms an interconnect;
        a no-flux barrier disposed between the first and second conductor, wherein the no-flux barrier is substantially impermeable to mass flux;
        a third conductor; and
        a test barrier disposed between the second and third conductor, wherein the test barrier is to be assessed for the magnitude of barrier permeability;
    a current source operable to conduct a current through the test structure;
    a timer operable to measure a lifetime of the test structure; and
    a processor for determining a permeability of the test barrier based on the measured lifetime of the test structure.

16. The system of claim 15, further comprising a heater for heating the test structure while conducting the current through the test structure.

17. The system of claim 15, wherein the current source is operable to conduct a substantially constant current through the test structure.

18. The system of claim 15, wherein the timer operable to measure a lifetime of the test structure, further comprises a detector operable to measure a change of resistance of the test structure, wherein a time to failure of the test structure is measured while measuring a change of resistance of the test structure.

19. The system of claim 18, wherein the timer and detector are further operable to determine a time at which the resistance of the test structure has changed by more than a predetermined percentage of an initial resistance.

20. The system of claim 15, wherein the no-flux barrier of the test structure has a thickness different from the thickness of the test barrier.

21. The system of claim 15, wherein the no-flux barrier of the test structure comprises a material different from the material of the test barrier.

22. The system of claim 15, wherein the test structure further comprises a via at the no-flux barrier between the first and second conductors, and a via at the test barrier between the second and third conductors.

23. The system of claim 15, wherein the test barrier of the test structure is deposited in the supply line.

24. A method of determining a barrier permeability, comprising: forming a test structure having a test barrier between a first conductor and a second conductor;
    conducting a current through the test structure;
    measuring a lifetime of the test structure; and
    assigning a barrier permeability value to the test barrier based on the measured lifetime.

25. The method of claim 24, further comprising heating the test structure while conducting the current through the test structure.

26. The method of claim 24, wherein conducting the current through the test structure comprises providing a substantially constant current.

27. The method of claim 24, wherein measuring a lifetime of the test structure comprises measuring a time to failure of the test structure while measuring a change of resistance of the test structure.

28. The method of claim 27, wherein measuring a time to failure of the test structure while measuring a change of resistance of the test structure comprises determining a time at which the resistance of the test structure has changed by more than a predetermined percentage of an initial resistance.

29. The method of claim 28, wherein determining a time at which the resistance of the test structure has changed by more than a predetermined percentage of an initial resistance comprises:
   determining if a maximum testing time has been exceeded, wherein if the maximum testing time has been exceeded, the test barrier is considered impermeable; and
   otherwise continuing the time to failure testing until the test barrier resistance has changed by more than the predetermined percentage of the initial resistance, whereupon the test structure is considered failed and the time to failure is identified.

30. The method of claim 24, wherein conducting a current through the test structure, comprises conducting a current through the test structure such that $(jL)_{TEST} < (jL)_{CRIT}$, wherein a test product of a current density and a length of the test structure being tested, is less than a critical product of a current density and a length of the test structure with a critical length.

31. The method of claim 30, wherein the critical length comprises a length of the test structure wherein the product $(jL)_{TEST} < (jL)_{CRIT}$ provides a sufficiently small enough product to insure immortality to electromigration failure for the test structure, wherein the no-flux barrier is impermeable.

32. The method of claim 24, wherein assigning a barrier permeability value to the test barrier based on the measured lifetime of the test structure comprises:
   receiving simulation lifetime data which is generally associated with the test structure, and correlating the measured lifetime of the test structure to a simulation lifetime $t_{SIM}$ from the simulation lifetime data; and
   assigning a barrier permeability value to the test barrier from a simulation permeability corresponding to the simulation lifetime based on the measured lifetime of the test structure.

33. The method of claim 24, wherein receiving simulation lifetime data which is generally associated with the test structure comprises lifetime data from a simulation lifetime results plot, wherein each simulation lifetime of the plot has a unique simulation permeability.

* * * * *